United States Patent [19]

Kawasaki et al.

[11] Patent Number: 4,688,029
[45] Date of Patent: Aug. 18, 1987

[54] ANALOG DISPLAY DEVICE

[75] Inventors: Hiroaki Kawasaki; Nobumitsu Kanetsuna, both of Mobara, Japan

[73] Assignee: Futaba Denshi Kogyo Kabushiki Kaisha, Mobara, Japan

[21] Appl. No.: 622,875

[22] Filed: Jun. 21, 1984

[30] Foreign Application Priority Data

Jun. 30, 1983 [JP] Japan .......................... 58-100107[U]

[51] Int. Cl.⁴ ........................ G01F 23/24; G09G 3/00
[52] U.S. Cl. ...................................... 340/754; 340/59; 340/618; 340/753
[58] Field of Search ............... 340/753, 754, 755, 793, 340/670, 52 R, 59, 521, 525, 618; 73/149, 861, 861.15, 223, 313, 322

[56] References Cited

U.S. PATENT DOCUMENTS

| | | | |
|---|---|---|---|
| 4,097,857 | 6/1978 | Miyakawa | 340/753 |
| 4,163,971 | 8/1979 | Morin et al. | 340/754 |
| 4,197,650 | 4/1980 | Bailey et al. | 340/754 X |
| 4,217,578 | 8/1980 | Inami et al. | 340/754 |
| 4,242,980 | 1/1981 | Go | 340/753 |
| 4,337,464 | 6/1982 | Karalla et al. | 340/753 |
| 4,450,440 | 5/1984 | White | 340/753 |
| 4,461,175 | 7/1984 | Baumgart et al. | 340/618 X |
| 4,486,747 | 12/1984 | Okamoto et al. | 340/753 |

*Primary Examiner*—Gerald L. Brigance
*Attorney, Agent, or Firm*—Oblon, Fisher, Spivak, McClelland & Maier

[57] ABSTRACT

An analog display device is disclosed which is capable of accurately displaying warning about input data. The device comprises a plurality of high range display segments and a plurality of low range display segments which are of any shape and alternately arranged in parallel to one another. At least a part of the low range display segments carries out display of color different from that of the high range display segments.

13 Claims, 12 Drawing Figures

FIG.7
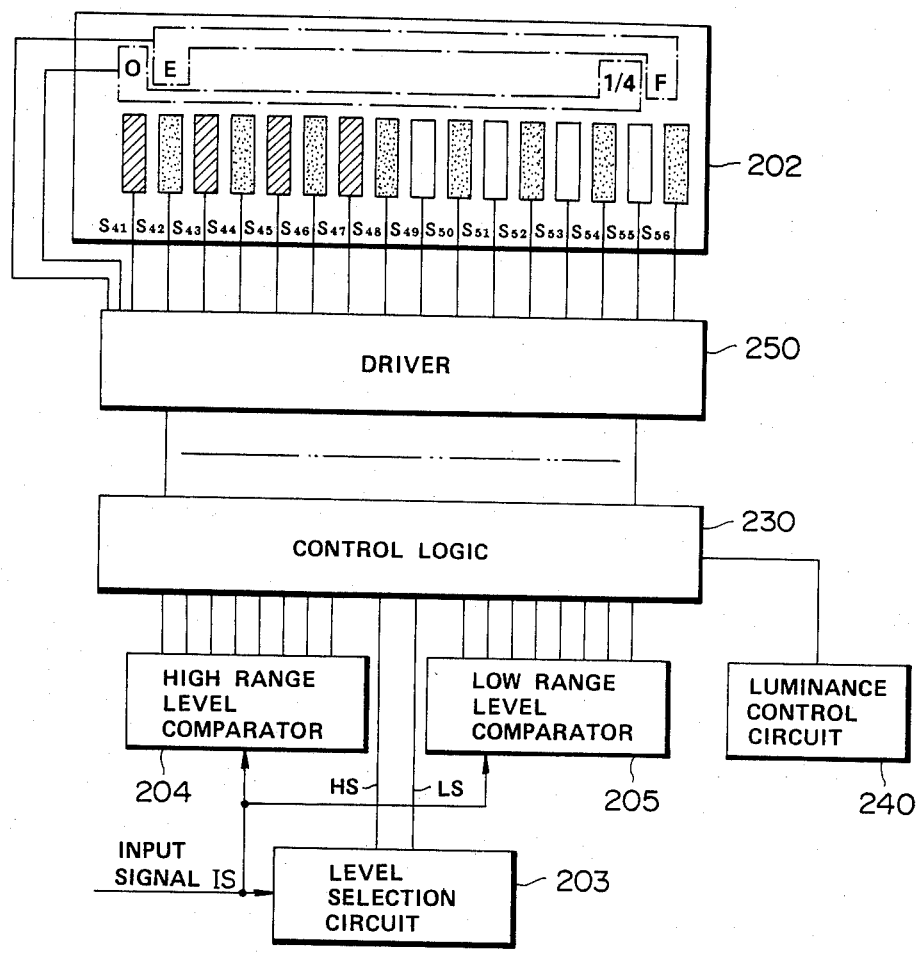
FIG.8(A)  FIG.8(B)  FIG.8(C)
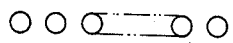 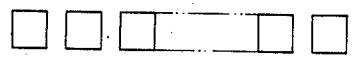 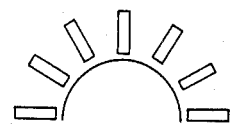

ANALOG DISPLAY DEVICE

BACKGROUND OF THE INVENTION

1. Field of the Invention

This invention relates to an analog display device, and more particularly to an analog display device having a plurality of display segments of any suitable shape, such as a bar shape, rectangle, polygon, circle or the like arranged in parallel to one another and adapted to accurately display a warning signal representing input data.

2. Description of the Prior Art

Recently, an analog display device has been extensively used, for example, for a fuel indicator, a thermometer or the like mounted on an instrument panel section of a dashboard of an automobile. Such an analog display device is constructed to display a warning signal of, for example, red to provide warning or caution representing input data, such as the residue of fuel oil, a temperature of a radiator or the like switching from a high range to a low range when magnitude of the input data is below a predetermined level.

Such a conventional analog display device is divided into three types. The conventional analog display device of the three types will be described in connection with a fuel indicator or gauge with reference to FIGS. 1 to 3.

The first type, as shown in FIG. 1, is to always illuminate display segments RS of warning color or red displaying a warning signal indicating that magnitude of input data is at a low level, together with display segments GS of green luminous color displaying a safety signal indicating the high level when the magnitude is below a predetermined level as well as the high level. The second type is constructed in such a manner as shown in FIGS. 2A and 2B. More particularly, it is adapted to illuminate display segments of green when magnitude of input data is above a predetermined level and display segments of red arranged at the left end when the magnitude is below the level, as shown in FIGS. 2A and 2B, respectively. The third type, as shown in FIG. 3, is constructed to vertically arrange two display scales S1 and S2 of the same color in parallel which serve to display a high level and a low level, respectively.

However, the conventional analog display device of such three types has such disadvantages as described hereinafter.

The first type is obliged to illuminate the display segments of warning color even when a warning signal is not required. The second type has a disadvantage that display of warning color significantly deviates from a position relative to a display scale for normal display. In order to minimize such disadvantages of the first and second types, there are generally provided two display segments RS of warning color. Nevertheless, in the analog display device of the first and second types, it is almost impossible to quantitatively indicate the degree of warning so that an observer may accurately notice the quantitative degree of warning. Also, the display patterns indicating the warning and the safety signals become unbalanced in design.

Further, the analog display device of the third type has a disadvantage that an observer cannot rapidly notice the degree of warning because the high and low levels are displayed on the respective display scales.

OBJECTS OF THE INVENTION

The present invention has been made in view of the foregoing disadvantages of the prior art.

Accordingly, it is an object of the present invention to provide an analog display device which is capable of carrying out the switching from display of safety color to that of warning color to display the degree of warning while keeping the positional relationship between display scales when magnitude of input data is decreased below a predetermined level and the indication of warning is required.

It is another object of the present invention to provide an analog display device which is capable of allowing an observer to accurately and effectively notice input data.

It is a further object of the present invention to provide an analog display device which is capable of allowing a high range display scale of safety color and a warning display scale of warning color to be balanced in design even when those scales are lighted together.

SUMMARY OF THE INVENTION

In accordance with the present invention, there is provided an analog display device having a plurality of display segments of any suitable shape, such as a bar shape, rectangle, polygon, circle or the like arranged in parallel to one another. The analog display device comprises a plurality of high range display segments for indicating the entire magnitude of input data and a plurality of low range display segments for indicating magnitude of input data decreased below a predetermined level which are alternately arranged in parallel to one another, at least a part of the low range display segments being adapted to carry out display with color different from that of said high range display segments.

BRIEF DESCRIPTION OF THE DRAWINGS

Other objects and many of the attendant advantages of the present invention will be readily appreciated as the same becomes better understood by reference to the following detailed description when considered in connection with the accompanying drawings, wherein:

FIG. 7 is a block diagram showing the structure of a third embodiment of an analog display device according to the present invention; and FIGS. 8A, 8B and 8C each is a schematic view showing a modification of configuration and arrangement of display segments;

DETAILED DESCRIPTION OF THE PREFERRED EMBODIMENTS

Now, an analog display device according to the present invention will be described with reference to the drawings.

Figure 1:
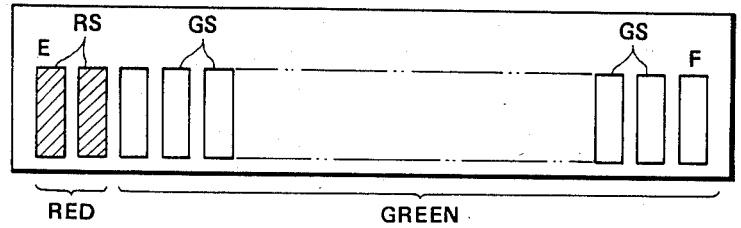
FIGS. 1, 2A and 2B, and 3 are schematic views showing conventional analog display devices.
Figure 2A:
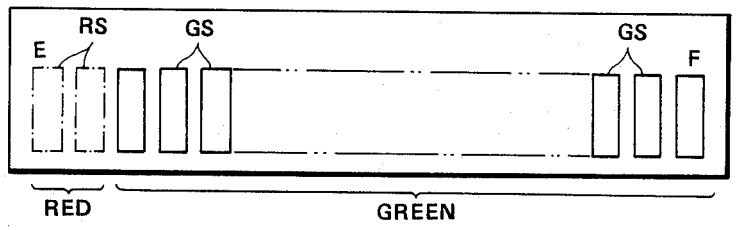
Figure 2B:
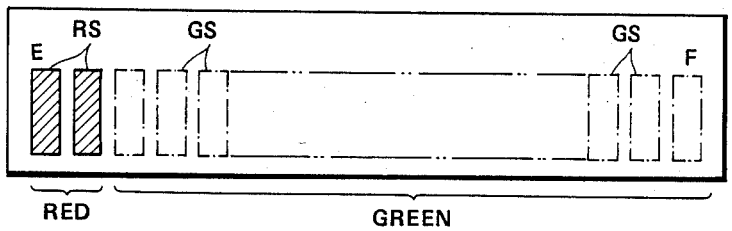
Figure 3:
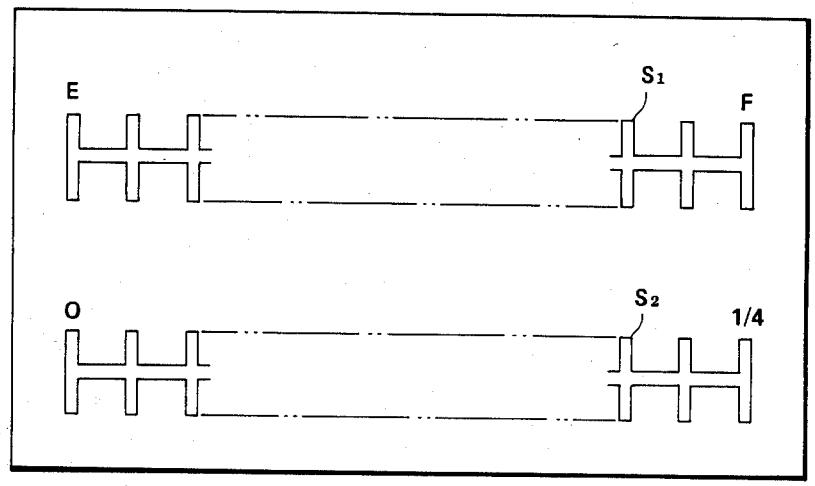
Figure 4:
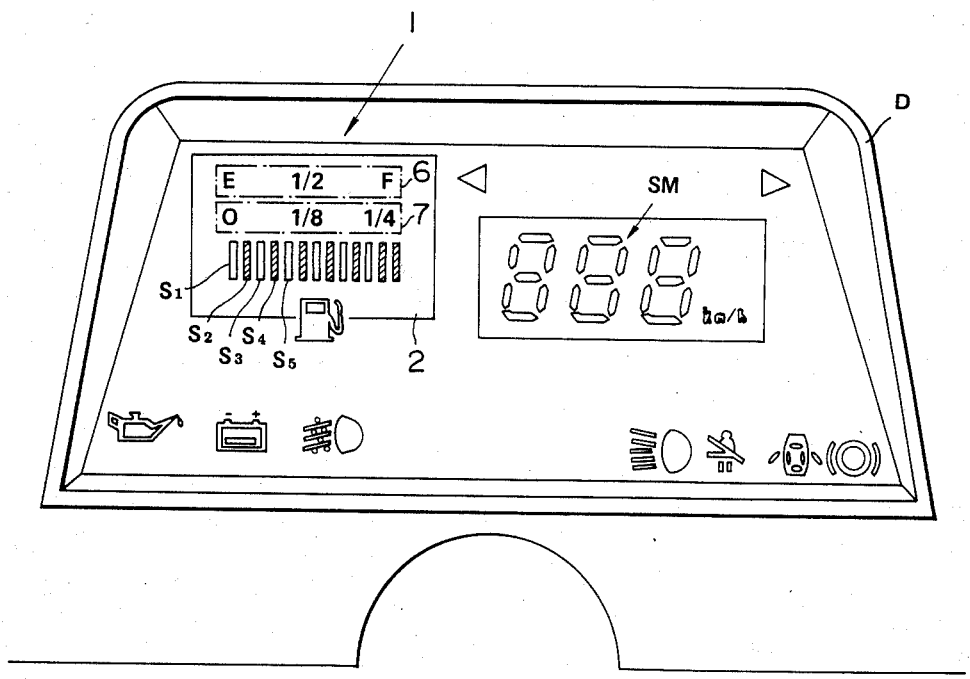
FIG. 4 is a front view showing a dashboard of an automobile on which a first embodiment of an analog display device according to the present invention is installed.
Figure 5:
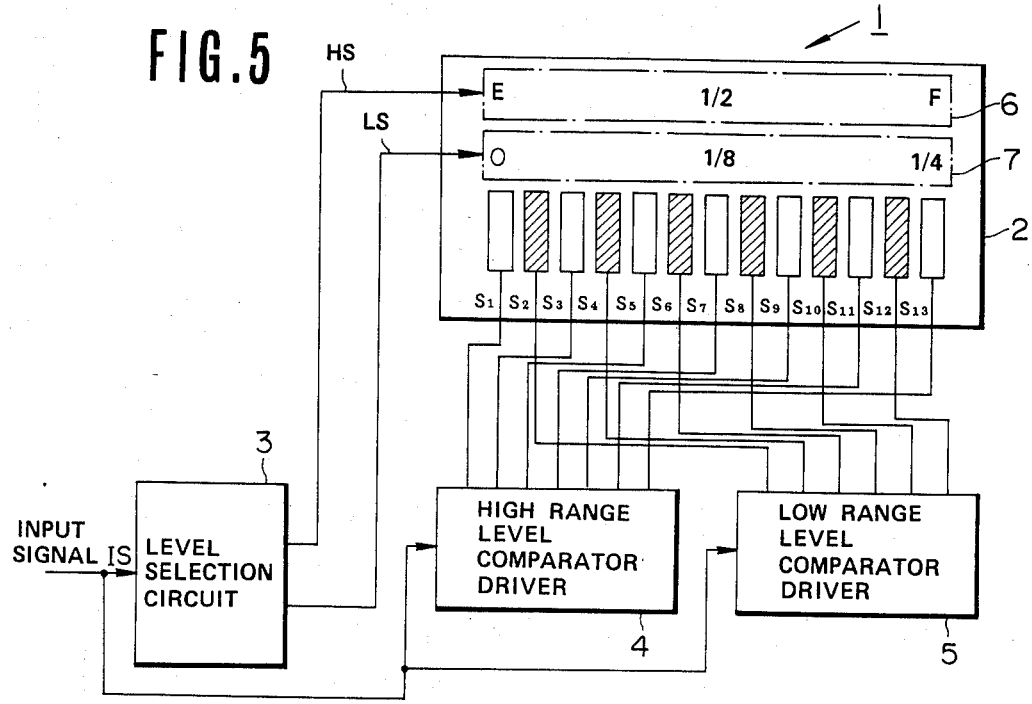
FIG. 5 is a block diagram showing the structure of the first embodiment of the analog display device shown in FIG. 4.

FIG. 4 is a front elevation view showing a dashboard of an automobile on which a first embodiment of an analog display device according to the present invention is installed. FIG. 5 is a block diagram showing the structure of the analog display device shown in FIG. 4.

In FIG. 4, reference character D designates a dashboard of an automobile, which is formed thereon with display patterns constituting display sections of various instruments. More specifically, the dashboard D has a pattern display section SM for a speedometer provided on the central portion thereof and an analog display device 1 according to the present invention arranged on the left side of the pattern display section SM. In the illustrated embodiment, the display device 1 constitutes a display section of a fuel indicator.

The analog display device 1 shown in FIG. 5 comprises a level display section 2, a level selection circuit 3, a high range level comparator driver 4, a low range level comparator driver 5, a high range display section 6, and a low range display section 7. The level display section 2 includes a plurality of high range display segments S1, S3, S5, S7, S9, S11 and S13 and a plurality of low range display segments S2, S4, S6, S8, S10 and S12 which have a bar shape and colors different from each of the display segments and are alternately arranged in parallel to one another. The level selection circuit 3 generates a high level signal HS when the magnitude or volume of an input signal IS representing input data or the residue of fuel in a fuel tank of an automobile is above a predetermined level SV and generating a low level signal LS when it is decreased below the predetermined level SV, which corresponds to one fourth of the level of filled fuel in the illustrated embodiment. The high range level comparator driver 4 selectively illuminates the high range display segments S1, S3, S5, S7, S9, S11 and S13 of the level display section 2 dependent upon the magnitude of input signal IS. The low range level comparator driver 5 selectively illuminates the low range display segments S2, S4, S6, S8, S10 and S12 of the level display section 2 dependent upon the magnitude of input signal IS. The high range display section 6 is connected to the level selection circuit 3 and illuminated in response to the high level signal HS to effect luminous display. The low range display section 7 is connected to the level selection circuit 3 and illuminated in response to the low level signal LS.

The high range display segments S1, S3, S5, S7, S9, S11 and S13 each have a phosphor layer deposited thereon. In the illustrated embodiment, the phosphor layer comprises ZnO:Zn which emits light of safety color, such as, for example, green. The words "safety color" used herein refer to green, blue and white, and colors similar thereto. The low range display segments S2, S4, S6, S8, S10 and S12 each have a phosphor layer emitting light of warning color deposited thereon, which comprises (Zn, Cd)S:Ag, Cl which is subjected to a low velocity electron excited phosphor by mixing $In_2O_3$ or $ZnOWo_3$ therewith and emits reddish orange-color in the illustrated embodiment. The words "warning color" used herein refer to red, orange and yellow, and colors similar thereto.

The high range display section 6 and the low range display section 7, as shown in FIG. 5, are positioned at the upper area of the level display section 2. More particularly, indications E and F of the high range display section 6 indicating that fuel in the fuel tank is substantially empty and that the tank is filled with fuel are positioned above the high range display segments S1 and S13, respectively. Indications 0 and $\frac{1}{4}$ of the low range display section 7 indicating that the residue of fuel is substantially zero and that the level of fuel in the tank is one fourth of that of filled fuel or the full charge are positioned above the low range display segments S2 and S12, respectively.

Further, indication $\frac{1}{2}$ of the high range display section 6 indicating that the level of fuel in the tank is one half of that of filled fuel and indication $\frac{1}{8}$ of the low range display section 7 indicating the level of fuel is at one eighth are positioned above the high range display segment S7 and the low range display segment S8.

Thus, the indications E, $\frac{1}{2}$ and F of the high range display section 6 are displayed with, for example, green (which is a safety color) or white according to the high level signal HS, whereas the indications 0, $\frac{1}{8}$ and $\frac{1}{4}$ of the low range display section 7 are displayed with red (which is a warning color) or white according to the low level signal LS.

Now, the manner of operation of the analog display device constructed as described above will be described with reference to FIG. 5.

First, when a fuel tank of an automobile is filled with fuel, an input signal IS of magnitude corresponding to the full charge is supplied to the level selection circuit 3, and then a high level signal HS is generated from the level selection circuit 3, because the magnitude of the input signal IS is above the predetermined level SV. This allows the indications E, $\frac{1}{2}$ and F of the high range display section 6 to be illuminatned, and also the high range level comparator driver 4 causes the high range display segments S1, S3, S5, S7, S9, S11 and S13 of a safety color such as green to be illuminated together.

Then, when the residue of fuel is gradually decreased by consumption to cause the magnitude of the input signal IS to be reduced, the high range level comparator driver 4 serves to turn off the high range display segments S13, S11 and S9 in order, and, when the residue of fuel is below one half of filled fuel and the residue of fuel is gradually further decreased by consumption, the magnitude of the input signal IS is further decreased, the high range display segments S7, S5, S3 and S1 are turned off in order. Further, when the magnitude of the input signal IS reaches the predetermined level SV or the residue of fuel is one fourth of filled fuel or the full charge, the switching from a high range to a low range is carried out to allow the level selection circuit 3 to generate the low level signal LS instead of the high level signal HS. This results in display of the indications E, $\frac{1}{2}$ and F of the high range display section 6 being turned off and the indications 0, $\frac{1}{8}$ and $\frac{1}{4}$ of the low range display section 7 being illuminated instead, and the low range level comparator driver 5 operates to allow the low range display segments S2, S4, S6, S8, S10 and S12 to be illuminated to effect display of a warning color such as red.

Furthermore, when the residue of fuel is below one fourth of the filled fuel level, thereby causing the magnitude of the input signal IS to be below the predetermined level, the low range level comparator driver 5 operates to turn off the low range display segments S12, S10 and S8 in order, and, when the residue of fuel approaches zero from the point of less than one eighth of the filled fuel level, the low range display segments S6 and S4 are turned off.

When the volume of fuel acting as input data is full, the high range display segments S1, S3, S5, S7, S9, S11 and S13 are illuminated to accomplish display of a safety color to indicate the full tank with a full scale. When the residue is one fourth of filled fuel, thereby causing the magnitude of the input signal IS to be at the predetermined level, the switching operation from the high range to the low range is carried out to permit the low range display segments S2, S4, S6, S8, S10 and S12 to be illuminated to accomplish luminous display of a warning color. In this instance, the display scale of these low range display segments can be expanded to have substantially the same width as the display scale of the high range display segments of a safety color, and the scale of a warning color is positioned in relation to that of the safety color so that any deflection does not substantially occur therebetween. Thus, it will be noted that the analog display device of the first embodiment can accurately and effectively provide an observer with a warning signal.

The analog display device of the first embodiment described above may be constructed in a manner to arrange either the high range display section 6 or the low range display section 7 below the level display section 2.

The first embodiment is adapted to carry out a safety display and a warning display with two colors. However, the present invention is not limited to such colors and may be constructed to carry out a safety display, a warning display indicating caution and a warning display indicating danger with three colors.

Figure 6:
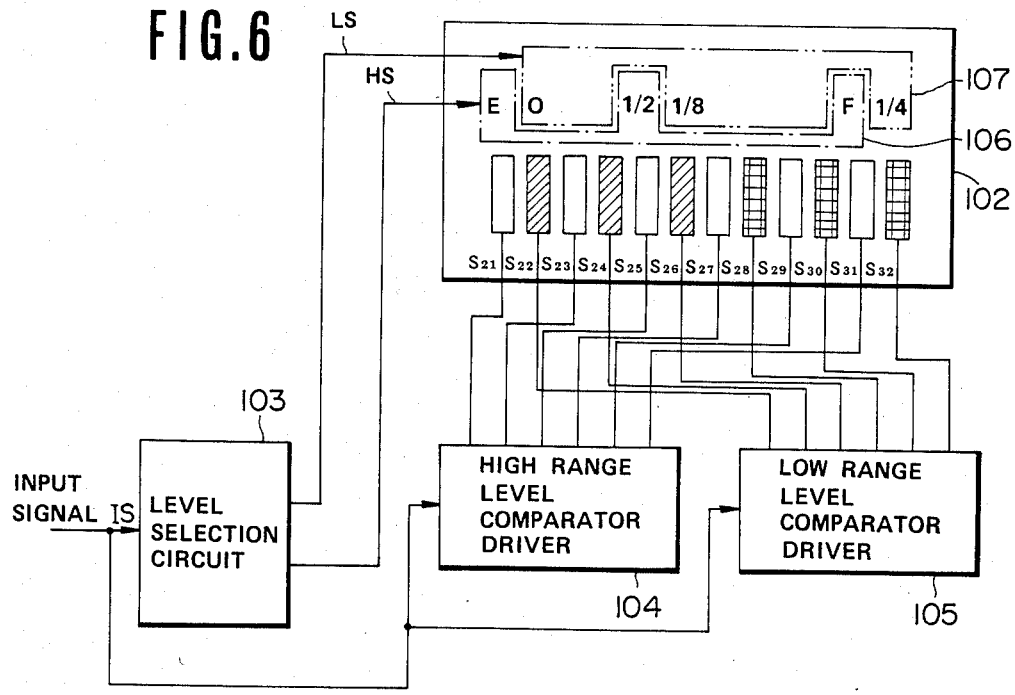
FIG. 6 is a block diagram showing the structure of a second embodiment of an analog display device according to the present invention.

FIG. 6 shows a second embodiment of an analog display device according to the present invention which is adapted to carry out the analog display with three colors. In the second embodiment shown in FIG. 6, high range display segments S21, S23, S25, S27, S29 and S31 and low range display segments S22, S24, S26, S28, S30 and S32 are alternately arranged in parallel to one nother in a level display section 102. The high range display segments S21, S23, S25, S27, S29 and S31 each has a phosphor layer of a safety color deposited thereon, which comprises ZnO:Zn emitting green luminous color in the embodiment. The low range display segments S22, S24 and S26 each has a phosphor layer of, for example, (Zn, Cd)S:Ag,Cl deposited thereon to emit a warning light of red which is subjected to a low velocity electron excited phosphor by mixing IN$_2$O$_3$ or ZnOWO$_3$ therewith, and each of the low range display segments S28, S30 and S32 has a low velocity electron excited phosphor layer of, for example, (Zn, Cd)S:Au,Al deposited thereon to emit a luminous color of yellow i.e., a color other than a safety color and a warning a color, such as red, orange or color similar thereto.

The second embodiment is operated in substantially the same manner as the first embodiment. More particularly, when a fuel tank of an automobile is filled with fuel, a high range level comparator driver 104 operates in response to an input signal IS to illuminate all the high range display segments S21, S23, S25, S27, S29 and S31 and generate a high level signal HS from a level selection circuit 103 to allow indications E, ⅔ and F of a high range display section 106 to be lighted. The gradual decrease in fuel causes the high range level comparator driver 104 to operate to turn off the high range display segments S31, S29, S27, S25, S23 and S21 in order. Then, when the magnitude of the input signal IS is decreased to a predetermined level SV or the residue of fuel in the tank is one fourth of the filled fuel, the switching from a high range to a low range is carried out. This allows a low range level comparator driver 105 to operate so that all the low range display segments S22, S24, S26, S28, S30 and S32 may be lighted up to emit light of yellow indicating warning (caution) and red indicating warning (danger). Also, the comparator driver 105 allows the low level signal LS to be generated from the level selection circuit 103 to light indications 0, ⅛ and ¼ of the low range display section 107. Further, when the residue of fuel is below one fourth of the filled fuel level, the low range level comparator drive 105 operates to turn off the low range display segments S32, S30 and S28 of yellow luminous color in order, and, when the residue of fuel is below one eighth and approaches zero, the low range display segments S26 and S24 of red luminous color are turned off in order.

As described above, the second embodiment is adapted to allow the display segments to emit light of three colors (e.g., green, yellow and red), so that an observer may be provided with effective indication of residual fuel because the residue of fuel is displayed in three stages of safety, warning (caution) and warning (danger) with colors different from one another. Also, the second embodiment accurately provides an observer with warning, because the indication that the input signal IS is at the predetermined level SV or the residue of fuel is one fourth of the filled fuel level is displayed with substantially the same scale width as that of the display in the safety color.

Now, a third embodiment of an analog display device according to the present invention will be described with reference to FIG. 7.

In the third embodiment, a level display section 202 has high range display segments S42, S44, S46, S48, S50, S52, S54 and S56 and low range display segments S41, S43, S45, S47, S49, S51, S53 and S55 alternately arranged therein in parallel to one another. The high range display segments S42, S44, S46, S48, S50, S52, S54 and S56 are adapted to emit light of a safety color, (such as, for example, green). The low range display segments S41, S43, S45 and S47 define a warning area of a warning color, (such as, for example, red), and the remaining low range display segments S49, S51, S53 and S55 define a caution area of, for example, green which is the same color as the high range display segments S42–S56.

Further, the analog display device of the third embodiment includes a high range level comparator 204 and a low range level comparator 205 which are adapted to light the display segments in response to the magnitude of an input signal IS, as in the first and second embodiments. The third embodiment illustrated also includes a level selection circuit 203 connected to a control logic 230 and a driver 250 connected via the control logic 230 to the high range level comparator 204 and the low range level comparator 205. The driver 250 is also connected to the high and low range display segments S41–S56. In addition, the control logic 230 is also connected to a luminance control circuit 240. The luminance control circuit 240 comprises a pulse width control circuit, a voltage control circuit or the like, and serves to decrease luminance of the low range display segments S49, S51, S53, and S55 of green luminous color at the time of lighting to, for example, one half of that of the high range display segments S42–S56 at the time of lighting and also to one half of the normal value of luminance of the high range display segments S42–S56 of green luminous color.

The third embodiment is constructed in the manner as described above. Accordingly, when a fuel tank of an automobile is filled with fuel, the high range level comparator 204 operates in response to the input signal IS to allow all the high range display segments S42, S44, S46, S48, S50, S52, S54 and S56 to be lighted to effect luminous display and a high level signal HS to be generated from the level selection circuit 203 to selectively display a high range scale. As fuel is gradually decreased, the high range display segments S56, S54, S52, S50, S48, S46, S44 and S42 are turned off or decreased in luminance to emit light of green a half tone in order. Then, when the magnitude of the input signal IS is decreased to a predetermined level SV or the residue of fuel is, for example, one fourth of the filled fuel level, the switching from a high range to a low range is carried out. This allows a low level signal LS to be generated from the level selection circuit 203 to selectively accomplish luminous display of a low range scale and operate the low range level comparator 205 to permit the low range display segments S41, S43, S45 and S47 to be lighted to emit red light and the low range display segments S49, S51, S53 and S55 to emit green light of a half tone with luminance lower than that of the high range display segments S42–S56. Also, as the residue of fuel is further decreased below one fourth of the filled fuel level, the low range display segments S55, S53, S51 and S49 of green luminous color of a half tone are turned off in order, and when the residue approaches zero, the low range display segments S47, S45, S43 and S41 of red luminous color are turned off in order.

The third embodiment is adapted to allow a part of the low range display segments to carry out display of warning luminous color (such as, for example, red) and the remaining low range display segments to display with the same luminous color as the high range display segments and luminance less than that of the high range display segments. Accordingly, it can carry out display with color of three types e.g., green, green of a half tone, and red. Thus, the embodiment can indicate the residue of fuel in three stages, although only two kinds of phosphor are used. Further, the analog display device of the third embodiment, even when the magnitude of the input signal IS is decreased to the predetermined level or the residue of fuel is, for example, one fourth of the full charge, accurately provides an observer with warning, because display may be carried out with the substantially the same scale width as that of the display of a safety color without deflecting the relative position between the two scales.

Figure 9:
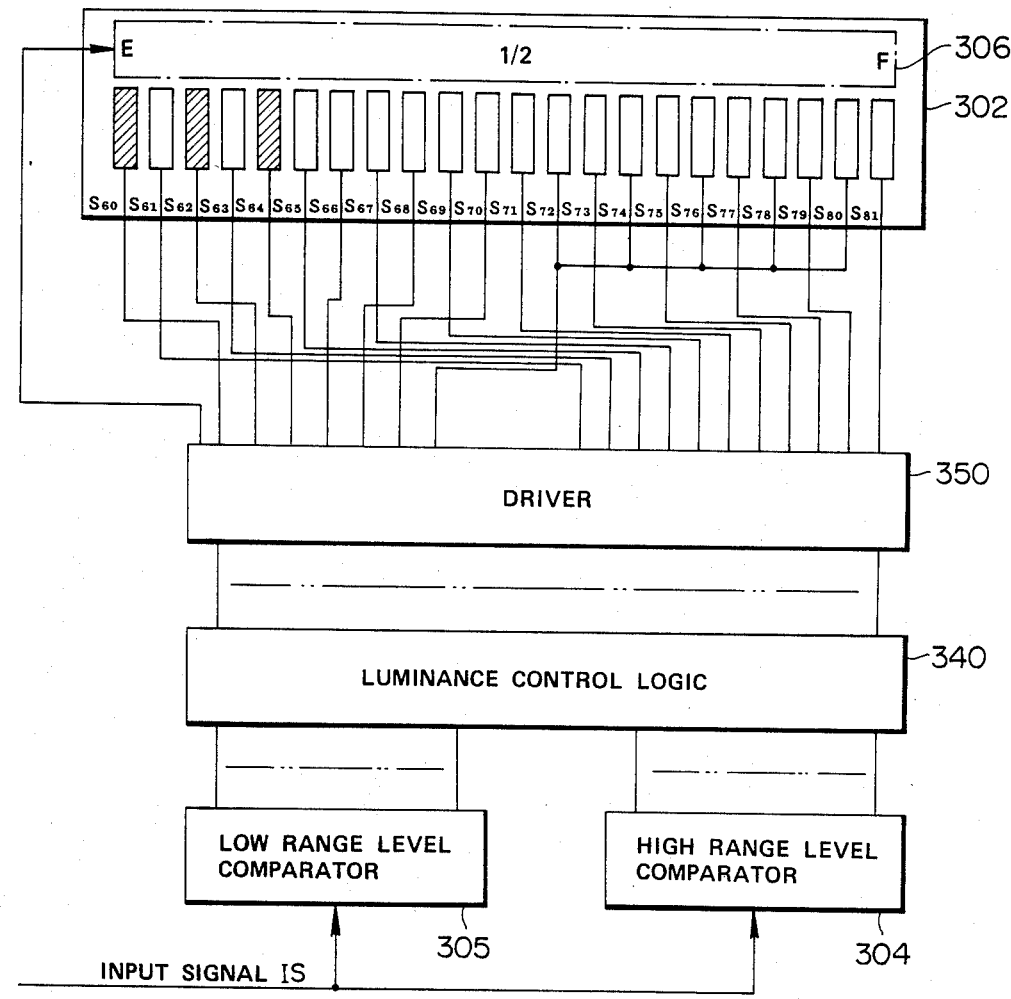
FIG. 9 is a block diagram showing the structure of a fourth embodiment of an analog display device according to the present invention.

FIG. 9 shows a fourth embodiment of an analog display device according to the present invention.

The fourth embociment of FIG. 9 is contructed in such a manner that high range display segments S61, S63, S65, S67, S69, S71, S73, S75, S77, S79 and S81 and low range display segments S60, S62, S64, S66, S68, S70, S72, S74, S76, S78 and S80 are alternately arranged in parallel to each other in a level display section 302. The high range display segments S61–S81 each have a phosphor layer of ZnO:Zn (green), ZnS:Zn (blue) or the like deposited thereon to carry out display of green or blue luminous color.

The low range display segments S60, S62 and S64 defines a warning range. In the illustrated embodiment, the warning range is formed by three bar-shaped display segments. However, the warning range may be formed by four or five display segments. The warning area exhibits display of a warning color (such as red or a color similar thereto), and the remaining low range display segments S66–S80 carry out display of the same color as the high range display segments S61–S81, (such as, for example, green or blue). The low range display segments forming the warning area each have a phosphor layer of (Zn,Cd)S:AgCl deposited thereon which exhibits display of red luminous color.

The analog display device of the fourth embodiment also includes a range display section 306 for indicating a range of the bar-shaped display segments which is arranged in the upper portion of the level display section 302. The range display section 306 is adapted to constantly display indications E, ½ and F with green or white without requiring the switching from a high level to a low level as in the embodiments described above.

The display segments S60–S81 of the level display section 302 are controlled by a circuit schematically shown in FIG. 9. More particularly, the control circuit comprises a high range level comparator 304 and a low range level comparator 305 for selecting the high range display segments S61–S81 or the low range display segments S60–S80 depending upon the magnitude of an input signal IS when the input signal is supplied to the circuit, a luminance control logic 340 connected to the high and low range level comparators 304 and 305, and a driver 350 connected via the luminance control logic 340 to the high and low range level comparators. The driver 350 is connected to the high range display segments S61–S81, the low range display segments S60–S80, and the range display section 306. The luminance control logic 340 is integrally formed by the same control logic and luminance control circuit as used in the third embodiment of FIG. 7 and serves to decrease luminance to carry out display of a half tone.

In the analog display device of the fourth embodiment constructed in the manner as described above, when a tank of an automobile is filled with fuel, the high range level comparator driver 304 operates in response to the input signal IS to allow all the high range display segments S61–S81 to be lighted to effect luminous display of a safety color such as green.

Then, when the volume of fuel is gradually decreased by consumption so that the magnitude of the input signal is gradually reduced, the high range level comparator driver 304, the luminance control logic 340, and the driver 350 operate to allow display of the high range display segments S81, S79 and S77 to be turned off in order or decreased in luminance in turn to carry out display of a half tone. When the magnitude of the input signal IS is decreased to a predetermined level or the residue of the fuel is, for example, below ½ of the full charge, the switching from a high range to a low range is carried out. In this instance, the display segments are shifted as the range display section stands, because indication of the low range is not displayed in an expanded scale. More specifically, when the magnitude of the input signal is below the predetermined level, the low range level comparator 305, the luminance control logic 340, and the driver 350 operate to carry out display of the low range display segments S60–S80. The low range display segments S60–S64 carry out luminous display of a warning color (for example, red) to indicate the minimum residue of fuel corresponding to one fourth of the filled fuel level of the full charge. The residue of fuel between $\frac{1}{4}$ and $\frac{1}{2}$ is indicated by green of normal luminance, and display of the residue of fuel between $\frac{1}{2}$ and F is made by green of a half tone. The latter may be indicated by turning off the luminous display.

When the residue of fuel is decreased below one half, the low range display segments S70, S68 and S66 are decreased in luminance of green luminous display in order dependent upon magnitude of the input signal to cause the display to be carried out with green of a half tone. Further, the decrease in the residue of fuel to below $\frac{1}{4}$ causes red luminous color of the low range display segments to have a half tone or be turned off in order dependent upon magnitude of the input signal.

The fourth embodiment accurately provides an observer with warning, because it can indicate the residue of fuel in three stages irrespective of phosphor of the two kinds being used therein. Further, the analog display device of the embodiment is adapted to indicate both the full charge of fuel and the actual residue thereof by bar-shaped display of the display segments arranged in a row so that the ratio of the residue to the full charge may be readily noticed at a glance.

The first and second embodiments described above may be constructed in a manner to provide a circuit for operating the high range display segments with a control circuit including a luminance control circuit as used in the third embodiment. Such construction allows luminous display of the high range display segments to be reduced in luminance in order instead of turning off in order as the residue of fuel is gradually decreased from the fuel charge (F) to one fourth indicated when the magnitude of the input signal IS is decreased to the predetermined level. Thus, this allows the residue of fuel to be displayed with a color of decreased luminance in a full scale, resulting in full scale display utilizing, for example, full scale display bars being eliminated.

In the present invention, the luminous color of high and low range display segments, the number of low range display segments to display with a warning color, the number of luminous colors of the low range display segments, the configuration and arrangement of the display segments, and the manner of display with decreased luminance are not limited to those employed in the embodiments described above. For example, the display element may comprise a light emitting diode, a liquid crystal or the like, other than a fluorescent display tube. The configuration and arrangement of the display segments may be made in various manners for example, by linearly arranging circular or rectangular display segments or radially arranging display segments of a bar shape, as shown in FIGS. 8(A) to 8(C). Also, luminous display of the low range display segments may be partially or entirely carried out with a warning color such as orange-color or yellow instead of red. Furthermore, the luminous color of the high range display segments is not limited to green or a color similar thereto. For example, the present invention may be constructed in a manner to allow the high range display segments to carry out display with a safety color such as blue or white, a part of the low range display segments to display with a warning color other than red (for example, orange-color), and the remaining low range display segments to carry out display of a color other than the safety color and the warning color, so that it may carry out display of luminous color of three kinds.

The embodiments descrbed above are in the form of a fuel indicator of an automobile. However, the analog display device of the present invention may be used for applications wherein it is desired to display other input data and to indicate warning. For example, the present invention may be used as a display device for an oil pressure gauge, a voltmeter, a thermometer, a speedometer or a torque meter of an automobile or aircraft, or the like. Also, it may be used as a paper indicator for a telex, a recorder, a copying machine, or a fluid level indicator in a tank and the like.

As described above, the present invention is constructed in the manner such that the high range display segments for indicating the whole magnitude of an input data and the low range display segments for indicating that the magnitude of the input data is below a predetermined level are alternately arranged in a row, and the low range display segments are adapted to partially or entirely carry out display of a luminous color different from that of the high range display segments. Thus, the present invention allows input data to be accurately and effectively noticed by an observer, because it can exhibit the degree of warning without deflecting the relative position between a high range display scale and a low range display scale by carrying out the switching from a luminous display indicating safety to a luminous display indicating a warning only when the magnitude of the input data is decreased below a predetermined level or the residue of fuel is below, for example, one fourth of the full charge, and warning is required. Also, the present invention allows a high range display scale of a safety color and a low range display scale of a warning color to be arranged together, keeping good balance in design. Further, the present invention is capable of indicating warning without proving a specific display means for low range display.

The present invention may also be constructed in the manner that the high range display segments exhibit luminous display of a safety color, a part of the low range display segments carries out luminous display of a warning a color such as red, orange or color similar thereto, and the remaining low range display segments display with a luminous color other than the safety color and the warning color, so that display using color of three kinds or more may be accomplished. Furthermore, a part of the low range display segments exhibits display of a warning color and the remaining low range display segments carry out display of the same color as that of the high range display segments decreasing luminance. Such construction permits luminous displays of "safety", "caution" and "danger" to be made in different luminance from each other. In this instance, since the switching from the high range to the low range is carried out, the present invention is capable of carrying out display utilizing a plurality of luminous colors and the high and low levels. Accordingly, it may store much input data and effectively prevent misunderstanding of the data.

Furthermore, the present invention may be constructed in a manner such that the high range display segments carry out display of decreased luminance when the magnitude of input data is above a predetermined level. This permits display to be always carried out in a full scale state.

While preferred embodiments of the invention have been described with a certain degree of particularity, obvious modification and variation are possible in light of the above teachings. It is therefore to be understood that, within the scope of the appended claims, the invention may be practiced otherwise than as specifically described.

What is claimed as new and desired to be secured by Letters Patent of the United States is:

1. An analog display device comprising:
a plurality of range scales each being capable of independent illumination;
a level display section having a plurality of high range display segments for indicating the remaining amount of the quantity being measured as a fraction between the maximum measurable amount of the quantity being measured a predetermined amount less than the maximum measurable amount of the quantity being measured and a plurality of low range display segments for indicating the remaining amount of the quantity being measured as a fraction between zero and the predetermined amount, said high and low range display segments being interspersed alternately arranged and in parallel to one another;
a level selection circuit for generating a high level signal when the magnitude of the quantity being measured is above the predetermined amount and for generating a low level signal when the magnitude of the quantity being measured is decreased below the predetermined amount and for selectively illuminating one of said range scales in response to said high level and low level signals;
a high range level comparator driver connected to each of said high range display segments for selectively illuminating said high range display segments depending upon the remaining amount of the quantity being measured:
a low range level comparator driver connected to each of said low range display segments for selectively illuminating said low range display segments depending upon the remaining amount of the quantity being measured; and
a range display section connected to said level selection circuit for indicating whether the remaining amount of the quantity being measured is above or below the predetermined amount.

2. The analog display device as defined in claim 1, wherein said low range display segments comprise color display elements emitting a color different from the color emitted by said high range display segments.

3. The analog display device as defined in claim 2, wherein said low range display segments comprise color display elements emitting a warning color selected from the group consisting of red, orange, and yellow.

4. The analog display device as defined in claim 1, wherein said high range display segments comprise color display elements emitting a safety color selected form the group consisting of green, blue, and white.

5. The analog display device as defined in claim 4, wherein said low range display segments include a first plurality of color display elements emitting a warning color selected from the group consisting of red and orange and a second plurality of color display elements emitting a color other than said safety and warning colors.

6. The analog display device as defined in claim 1, and further comprising a means for controlling the luminance of said display segments in said level display section.

7. The analog display device as defined in claim 6, wherein said means for controlling the luminance of said display segments comprises a pulse with control circuit.

8. The analog display device as defined in claim 6, wherein said means for controlling the luminance of said display segments comprises a voltage control circuit.

9. An analog display device comprising:
a plurality of range scales each being capable of independent illumination;
a level display section having a plurality of high range display segments for indicating the remaining amount of the quantity being measured as a fraction between the maximum measurable amount of the quantity being measured and a predetermined amount less than the maximum measurable amount of the quantity being measured and a plurality of low range display segments for indicating the remaining amount of the quantity being measured as a fraction between zero and the predetermined amount, said high and low range display segments being interspersed alternately and in parallel to one another, and means for selectively illuminating one of said range scales in response to said measured amount of said quantity being measured;
a driver connected to each of said high range and low range display segments for selectively illuminating said high range and low range display segments depending upon the remaining amount of the quantity being measured;
a means for controlling the luminance of said display segments, said means for controlling the luminance of said display segments being connected to said driver;
a high range comparator connected to said means for controlling the luminance of said display segments for selecting said high range display segments depending upon the remaining amount of the quantity being measured; and
a low range level comparator connected to said means for controlling the luminance of said display segments for selecting said low range display segments depending upon the remaining amount of the quantity being measured.

10. The analog display device as defined in claim 9 and further comprising a range display section connected to said driver for indicating whether the remaining amount of the quantity being measured is above or below the predetermined amount.

11. The analog display device as defined in claim 9, wherein said low range display segments comprise color display elements emitting a color different from the color emitted by said high range display segments.

12. The analog display device as defined in claim 9, wherein said high range display segments comprise color display elements emitting a safety colors selected from the group consisting of green, blue, and white.

13. The analog display device as defined in claim 12, wherein said low range display segments includes a first plurality of color display elements emitting a warning color selected from the group consisting of red and orange and a second plurality of color display elements emitting the same color as said high range display segments.

* * * * *